(12) United States Patent
Gerlock et al.

(10) Patent No.: US 6,407,923 B1
(45) Date of Patent: Jun. 18, 2002

(54) SUPPORT AND COOLING ARCHITECTURE FOR RF PRINTED CIRCUIT BOARDS HAVING MULTI-PIN SQUARE POST TYPE CONNECTORS FOR RF CONNECTIVITY

(75) Inventors: Kevin C. Gerlock, Santa Clarita; Klaas B. Bol, Los Gatos, both of CA (US)

(73) Assignee: Spectrian Corporation, Sunnyvale, CA (US)

(*) Notice: Subject to any disclaimer, the term of this patent is extended or adjusted under 35 U.S.C. 154(b) by 11 days.

(21) Appl. No.: 09/734,230

(22) Filed: Dec. 11, 2000

(51) Int. Cl.[7] .............................................. H01K 7/20
(52) U.S. Cl. ..................... 361/704; 361/719; 361/775; 174/262; 439/55; 439/59; 257/723; 257/724; 330/295
(58) Field of Search ................................ 361/687, 695, 361/683, 704, 707, 712, 721, 717–719, 748, 749, 760–763, 764, 775, 786–789, 792; 257/713, 720, 723–725; 174/16.3, 254, 252, 260, 262, 52.1, 52.6; 439/59, 62, 65, 67, 485–487, 61, 260; 330/295, 307, 286, 65–67; 333/125, 128, 136–137, 248, 250, 256, 257

(56) References Cited

U.S. PATENT DOCUMENTS

| | | | |
|---|---|---|---|
| 3,593,174 A | 7/1971 | White | 330/53 |
| 4,677,393 A | 6/1987 | Sharma | 330/286 |
| 4,724,400 A | 2/1988 | Luettgenau | 330/295 |
| 4,812,782 A | 3/1989 | Ajioka | 330/286 |
| 5,031,072 A | 7/1991 | Malhi et al. | 361/387 |
| 5,032,798 A | 7/1991 | Myer | 330/295 |
| 5,087,888 A | 2/1992 | Mountz et al. | 330/65 |
| 5,111,166 A | 5/1992 | Plonka et al. | 333/128 |
| 5,119,051 A | 6/1992 | Myer | 333/233 |
| 5,159,290 A | 10/1992 | Bartley et al. | 330/295 |
| 5,164,689 A | 11/1992 | Plonka | 333/128 |
| 5,329,248 A | 7/1994 | Izadian | 330/295 |
| 5,352,991 A | 10/1994 | Lispchultz et al. | 330/289 |
| 5,545,924 A | * 8/1996 | Contolatis et al. | 257/724 |
| 5,561,397 A | 10/1996 | Kumar et al. | 330/295 |
| 5,668,409 A | 9/1997 | Gaul | 257/723 |
| 5,930,112 A | * 7/1999 | Babinski et al. | 361/695 |
| 5,945,746 A | * 8/1999 | Tracewell et al. | 307/43 |
| 5,956,236 A | 9/1999 | Corisis et al. | 361/783 |
| 6,317,345 B1 | * 11/2001 | Hayward et al. | 363/65 |

* cited by examiner

Primary Examiner—Darren Schuberg
Assistant Examiner—Michael Datskovsky
(74) Attorney, Agent, or Firm—Allen, Dyer, Doppelt, Milbrath & Gilchrist, P.A.

(57) ABSTRACT

An 'orthogonally stacked' support and cooling architecture for RF signaling circuits includes a plurality of RF amplifier circuit cards mounted on edge-mountable RF printed circuit support and heat dissipation modules, that are affixed to a first side of a base plate, so that the RF circuit cards extend in a direction that is generally orthogonal to the base plate. Arranged on a second side of the base plate are RF distribution networks for the RF circuit cards. The RF signal distribution networks are RF-coupled to the RF printed circuit boards by blind-mating, square post type multi-pin connectors through the base plate. Orienting the RF distribution networks in a plane orthogonal to the RF circuit cards and having the heat exchangers extend into gaps between the modules serves to considerably reduce the size of the architecture.

17 Claims, 3 Drawing Sheets

SUPPORT AND COOLING ARCHITECTURE FOR RF PRINTED CIRCUIT BOARDS HAVING MULTI-PIN SQUARE POST TYPE CONNECTORS FOR RF CONNECTIVITY

CROSS-REFERENCE TO RELATED INVENTION

The present invention relates to subject matter depicted in U.S. Design Patent No. D428,850 issued Aug. 1, 2000, assigned to the assignee of the present application and the disclosure of which is incorporated herein.

FIELD OF THE INVENTION

The present invention relates in general to an RF circuit support architecture for securely retaining and providing for convective cooling of multiple printed circuit cards containing RF signaling circuits and components. In particular, the present invention is directed to a support structure in which RF printed circuit board support and cooling modules are effectively 'stacked' generally transverse to a first side of a base plate in mutually adjacent, spatially separated relationship. Each module includes a convectively cooled heat exchanger to which the RF printed circuit card is mounted and which extends into a gap between mutually adjacent boards. RF signal distribution networks associated with the RF printed circuit boards are disposed on the opposite side of the base plate, and are electrically (RF). coupled to the RF printed circuit boards of the modules by means of square post type multi pin connectors that extend through the base plate.

BACKGROUND OF THE INVENTION

A variety of communication systems are designed to be environmentally robust in terms of their hardware and signaling format. As a non-limiting example, for the case of a communication system intended for use with a plurality of UHF line-of-sight and satellite links, a multi-link transceiver mounting rack may contain diverse pieces of communication equipment, that typically include RF transmitters, RF receivers, and various digital signal processing units, which control the operation of the RF signaling components, and interface digital communications signals with attendant signal processing circuits. Since each communication link has its own dedicated signalling scheme (modulation format, link protocol, band occupancy assignment, etc.), suppliers of such equipment will typically provide each system as an integrated unit.

In a conventional multi-transistor RF power amplifier, it has been customary practice to mount the power divider, power combiner, power transistors, and associated circuitry, all on the same plane. This 'co-planar' housing approach has several drawbacks. First, not only is considerable area required for the entire assembly, but if a divider/combiner is employed, it becomes a significant portion of the overall layout, as the length of the transmission lines is dictated by the frequency of operation. A divider/combiner is preferred over commercially available surface mount couplers because it has less power loss.

Although they are relatively small sized devices, surface mount couplers require long lengths of transmission line between couplers and active circuitry, as the spacing of the active devices dictates the size of the assembly and is greater than the size of the coupler. These long lengths of transmission line dissipate power. The dissipated loss of each surface mount coupler is also greater than that of a microstrip hybrid coupler installed on a high quality dielectric. Microstrip hybrid couplers can be designed os that they occupy most of the space between the active devices and inter-connecting transmission line length is minimized. Surface mount couplers offer only a two-way power divider/combiner, so that the amplifier must have a binary number of combined stages. Properly designed cascaded hybrids can be employed to combine any number of stages from 2 to N.

In addition, complexity is added to the assembly by the necessity of physically separating the power transistors and the divider/combiner (usually by means of dividing walls), in order to ensure electrical isolation. Moreover, when more than two active stages are combined, it is a challenge to deliver DC power to the center devices without compromising the RF transmission paths. One solution would be to run the DC distribution beneath the RF paths; however, this method increases the cost and complexity of the assembly. Also, it is difficult to match the performance of all of the active devices, both in gain and phase, without some provision for subdividing the assembly into smaller sub-circuits for testing. Each port of the divider/combiner and the active amplifier sections can be connectorized to allow for ease of testing and matching. This solution increases costs, due to the number of connectors required, and increases size due to the length of the connectors.

SUMMARY OF THE INVENTION

Pursuant to the invention, the above-described shortcomings of a conventional RF circuit housing architecture are effectively obviated by means of an 'orthogonally stacked' support assembly, that is configured to provide maximum power density for a given volume, while still being able to dissipate heat generated from RF components, in particular, RF power amplifier transistors. As will be described, the support architecture of the present invention arranges a plurality of RF amplifier circuit cards (each of which may include a driver stage transistor and a pair of push-pull transistors for the output stage) on associated edge-mountable RF printed circuit support and heat dissipation modules.

These edge-mountable modules are affixed to a first side of a base plate, so that the RF circuit cards or boards mounted thereto extend generally in a direction that is essentially transverse or orthogonal to the base plate. Arranged on a second side of the base plate are RF distribution networks for the RF circuit cards, that may include quadrature hybrid couplers for both power divider and complementary power combiners. These RF signal distribution networks are RF-coupled to the RF printed circuit boards by means of relatively inexpensive blind-mating, square post type multi-pin connectors that extend through the base plate.

Thus, in the invention, rather than being placed side-by-side on a common heat sink, the active amplifier sub-circuits are effectively mounted in a 'stacked' modular arrangement and having individual heat sinks. For each module, the area of the transistors and associated circuitry of each RF amplifier circuit card is the same, as is the case with their associated divider/combiners on the second side of the base plate. Since the divider and combiner circuits are oriented in a plane orthogonal to the RF circuit cards, the required area and volume is considerably reduced.

RF and DC connections for a respective RF circuit card are provided at one edge of a module's RF printed circuit card, with input and output RF connections spaced apart at opposite ends of the RF circuit board and DC power connected near the center of the board. In contrast, a conventional co-planar layout usually places the RF connections at opposite ends of the circuit. Thus, all of the RF amplifier circuit cards may be identical, since there are no special considerations as to the routing of DC power to centrally located cards.

This adjacent parallel mounting or 'stacking' of the RF sub-circuit cards allows each to be individually shielded, so as to ensure very high isolation between each active RF circuit card and the power divider and combiner circuitry on the opposite side of the base plate. Also, within the RF distribution circuitry on the bottom of the base plate, the RF combiner circuitry may be electrically separated from the RF combiner by a center wall region therebetween along which DC power is provided. The three-pin configured post-type RF connectors are designed so that they are completely shielded by conductive material (e.g., aluminum) of the assembly so as to minimize electromagnetic interference (EMI) and RFI leakage. RF power may be supplied at the top of the assembly and RF output derived at the bottom, thereby providing a maximum separation to minimize feedback.

DC power distribution is readily accomplished by mounting a separate circuit board to the back side of the divider/combiner support plate into which each edge-mounted RF circuit card and heat sink assembly is plugged. The design of the divider/combiner on the underside of the base plate is such that RF connections are located near the outer edge of the assembly. The area between the RF connectors, on the back side of the divider/combiner assembly, is then used to support a DC power distribution board. This area would normally be wasted space in a conventional co-planar amplifier layout. However, with the DC distribution board attached to the divider/combiner assembly, all of the RF and DC connector pins are aligned with one another, allowing a card mounting assembly to be readily blind-mated and held in position with screws. A small amount of floating of the square-post three-pin connectors allows for alignment during assembly. DC power is delivered at a common point on the top of the assembly.

Advantageously, with the architecture of the invention, the active device sub-circuits can be individually tested and aligned, to ensure that the power division and re-combination is optimal, before being installed in the assembly. The stacked alignment of the RF circuit card modules ensures that the gain and insertion phase falls within certain established limits, which allows for easy repair of the overall RF amplifier by replacing a failed card with a suitably aligned spare. Conventional co-planar designs may require intensive disassembly, alignment and re-assembly.

DETAILED DESCRIPTION

Figure 1:
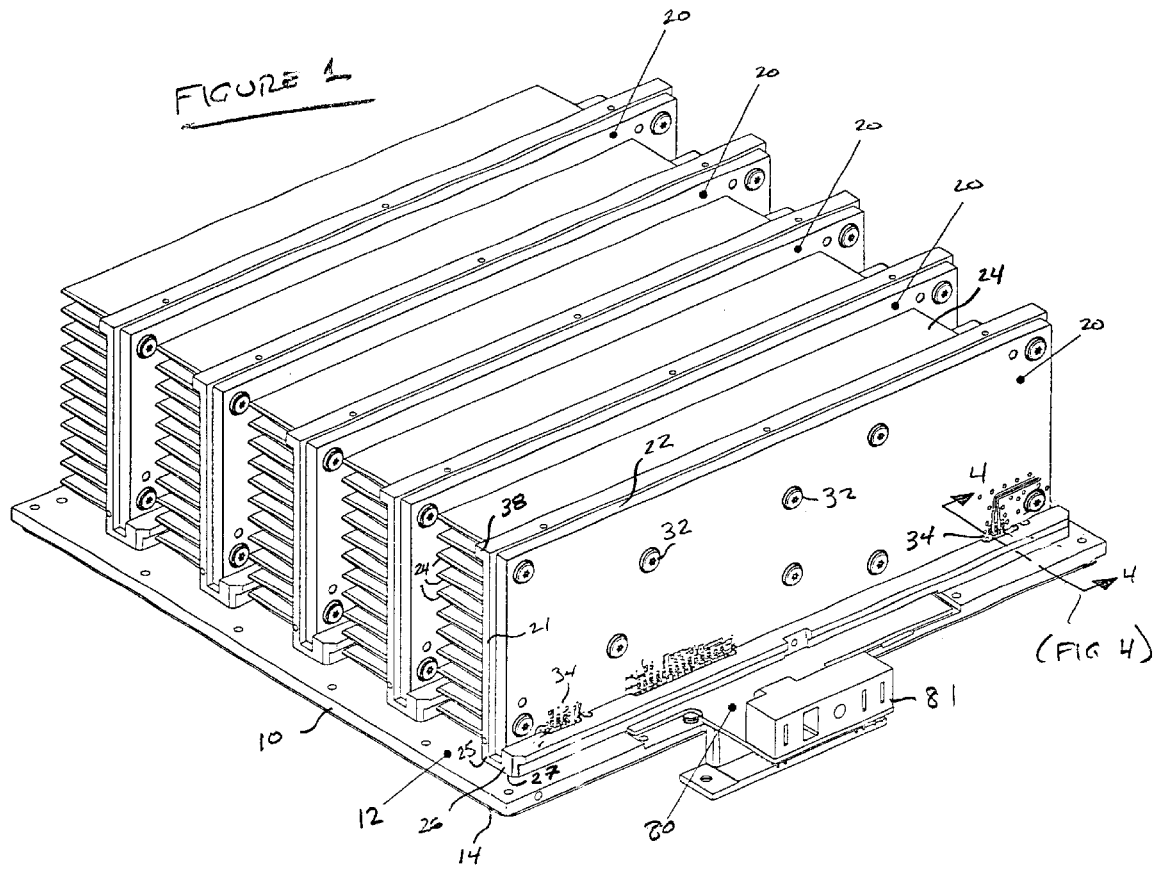
FIG. 1 is a diagrammatic perspective view of the RF circuit support architecture of the present invention (absent protective covers.
Figure 3:
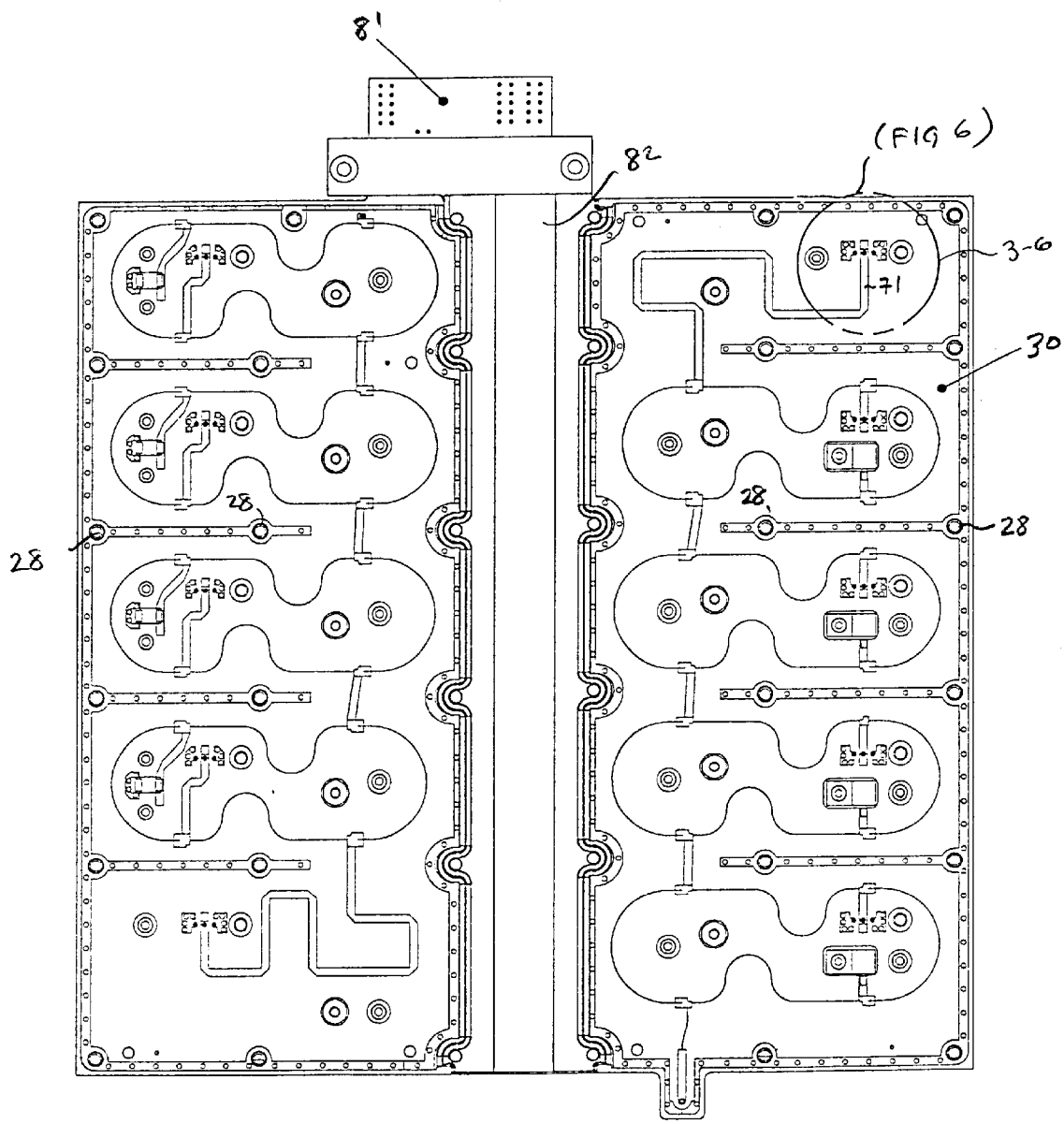
FIG. 3 is a bottom view of the RF circuit support architecture of FIG. 1, showing an RF divider/combiner distribution network assembly.

Attention is initially directed to FIG. 1, which shows a perspective view of the overall configuration of the RF circuit support architecture of the present invention (absent covers for the RF circuits), for the non-limiting example of supporting (N=5) RF amplifier circuit boards within an integrated housing unit. As shown therein, a rigid, generally planar conductive base plate 10, such as an aluminum plate, has a first side thereof 12, upon which a plurality of edge-mounted RF circuit board modules 20 are affixed, so as to support respective RF printed circuit boards 22 in a direction that is essentially transverse (e.g. orthogonal) to the base plate 10. The modules 20 may include protective covers (not shown) for the RF printed circuit boards. A second side 14 of the base plate 10 supports an arrangement of N (five in the present example) RF signal distribution networks 30 (e.g., combiner/divider including quadrature hybrid couplers) shown in detail in the plan view of FIG. 3 associated with RF signaling circuits of the RF printed circuit board modules 20. Although not shown in FIG. 3, a protective cover for the RF distribution networks 30 may be attached to the base plate 10.

Figure 2:
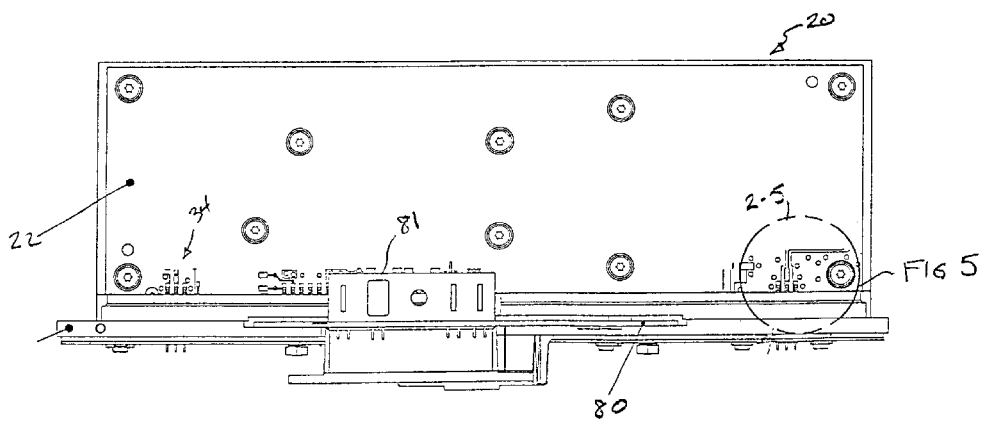
FIG. 2 is a diagrammatic end view of the RF circuit support architecture of FIG. 1.
Figure 4:
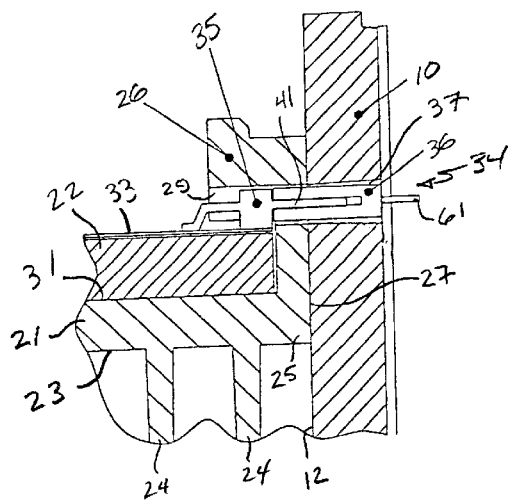
FIG. 4 is an enlarged partial sectional view of a respective RF printed circuit card assembly mounted to the base plate of the RF circuit support architecture of the present invention, taken along lines 4—4 in FIG. 1.

As further shown in the perspective view of FIG. 1, the side view of FIG. 2 and the enlarged partial sectional view of FIG. 4, a respective RF printed circuit board support and cooling module 20 is comprised of a generally planar, electrically and thermally conductive land region 21, from a first side 23 of which project a plurality of heat exchanger fins 24 over which a cooling fluid, such as forced air, may pass, for removing heat from the circuit components of the printed circuit board module 20. The heat exchanger fins 24 project in a direction that is substantially orthogonal to the land region 21, and occupy the volume of space between the spaced apart modules 20 affixed to the first side 12 of the base plate 10. As described above, this 'orthogonal' physical integration of the various components provides for a very efficient use of the available volume within the support structure of the invention.

A first, base end 25 of the land region 21 of the RF printed circuit board module 20 terminates at a generally L-shaped flange 26, the bottom 27 of which is configured to abut directly against the first side 12 of the base plate 10. The L-shaped flange 26 is sized to receive mounting hardware, such as screws and the like (shown at 28 in the bottom view of FIG. 3), that are insertable through bores in the base plate 10 and may be screwed into tapped bores (not shown) in the flange 26 of the module. A second, upper end of the land region 21 has a lip 38 that defines the upper or top end portion of a respective RF printed circuit module 20.

The land region 21 of a respective RF circuit module 20 has a generally planar second side 31, to which an RF signaling circuit board 22 is affixed, as by means of hardware fittings, such as screws 32. As described above, as a non-limiting example, the RF signaling circuitry 33 of the printed circuit board 22 may include an RF amplifier driver stage transistor and a pair of push-pull transistors for the RF output stage.

In order to provide RF connectivity to the RF signaling circuitry 33 of the printed circuit board 22, a plurality of first multi-pin (three-pin) connectors 34 are mounted at an edge region 35 of the board 22 adjacent to the first end 25 of the land region 21 of the module 20. In a preferred, but non-limiting embodiment, a male connector portion 35 of a mated pair of three-pin connectors 34 is mounted to the board 22, proper. As shown in the enlarged sectional view of FIG. 4 and the enlarged side view of FIG. 5, the three-pin connector 34 has a three-pin, 0.025" square post, male, surface mount technology (SMT) connector 35 arranged to engage a three-pin female receptacle 36. As pointed out above, this type of square-post connector is primarily intended for DC applications, so that the cost of a mated pair is much less than typical coaxial connectors. In order to accommodate the connectors 34, the generally L-shaped flange 26 of the module 20 is provided with an aperture or slot 29, that is aligned with a complementary aperture 37 in the base plate 10.

Because the male connector 35 is an SMT component it may be readily installed with pick-and place (robotic) equipment. Also, the length of a mated pair of multi-pin connectors 34 is relatively small (on the order of only approximately one-half that of a typical SMA connector pair). The square-post female connector 36 is retained in the aperture 37 through the base plate 10, so that the female connector portion 36 has a small amount of play, or 'floats', thereby providing for blind mating of the male and female portions of the connectors 34 within the mechanical tolerances of the orthogonal connector design of the invention.

Figure 5:
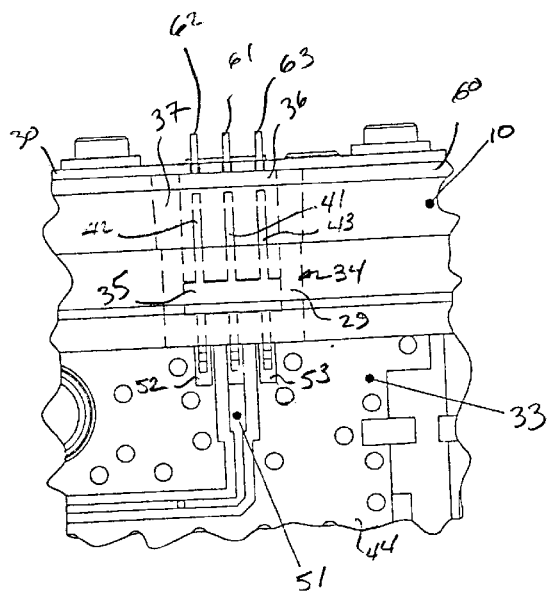
FIG. 5 is an enlarged view of that portion of the diagrammatic end view of the RF circuit support architecture of FIG. 2 surrounded by circle 2–5.

As further shown in the enlarged side view of FIG. 5, the center pin 41 of the male connector 35 is (surface mount)-attached to a section of microstrip conductor 51 of the printed circuit board 22. The microstrip conductor 51 has a stepped size in geometry and spacing from an adjacent ground plane conductor 54 in the vicinity of its connection with the center pin width, in order to provide impedance matching compensation between the connector 34 and the microstrip transmission line of the RF printed circuit. Respective pins 42 and 43 of the male connector 35 on opposite sides of the center pin 41 are (surface mount)-attached to respective portions 52 and 53 of RF ground plane conductor 54 of the printed circuit board 22.

Figure 6:
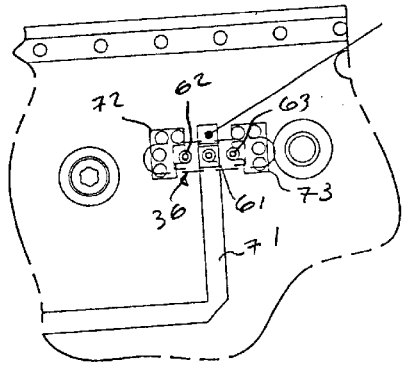
FIG. 6 is an enlarged view of that portion of the diagrammatic bottom view of the RF circuit support architecture of FIG. 3 surrounded by circle 3–6.
Figure 1:
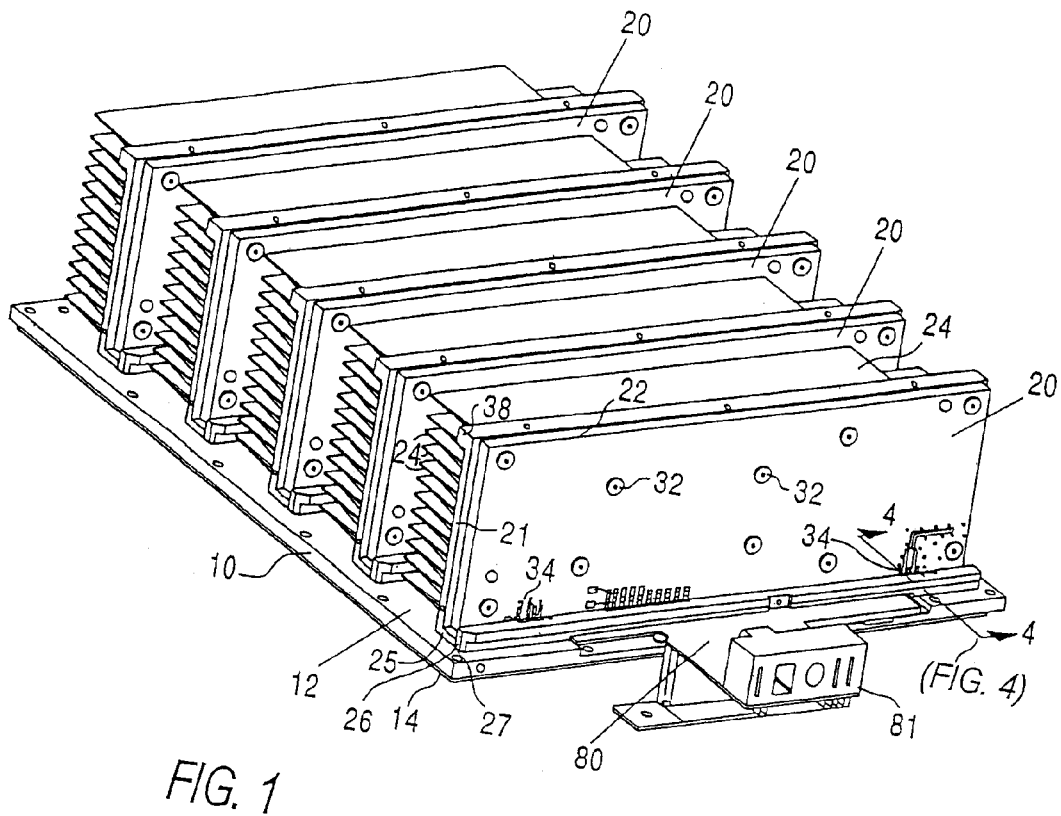
Figure 2:
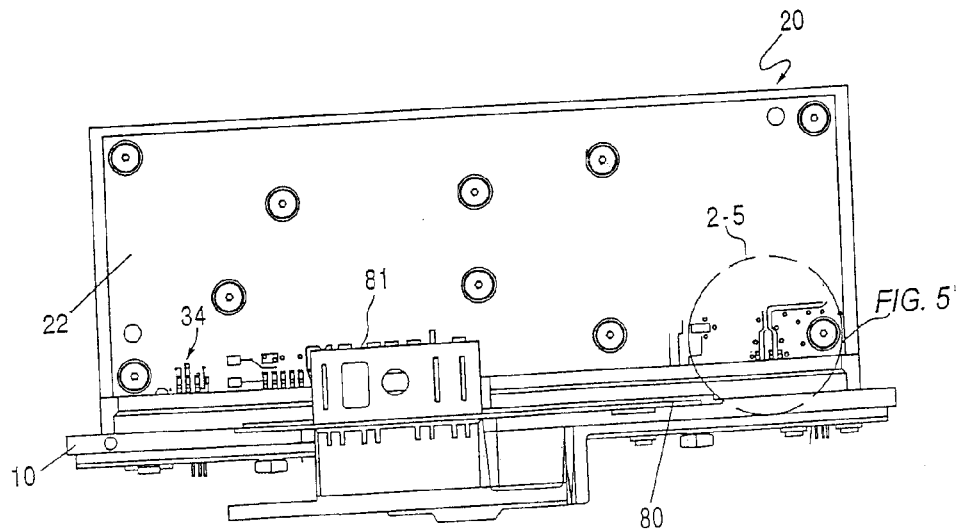
Figure 3:
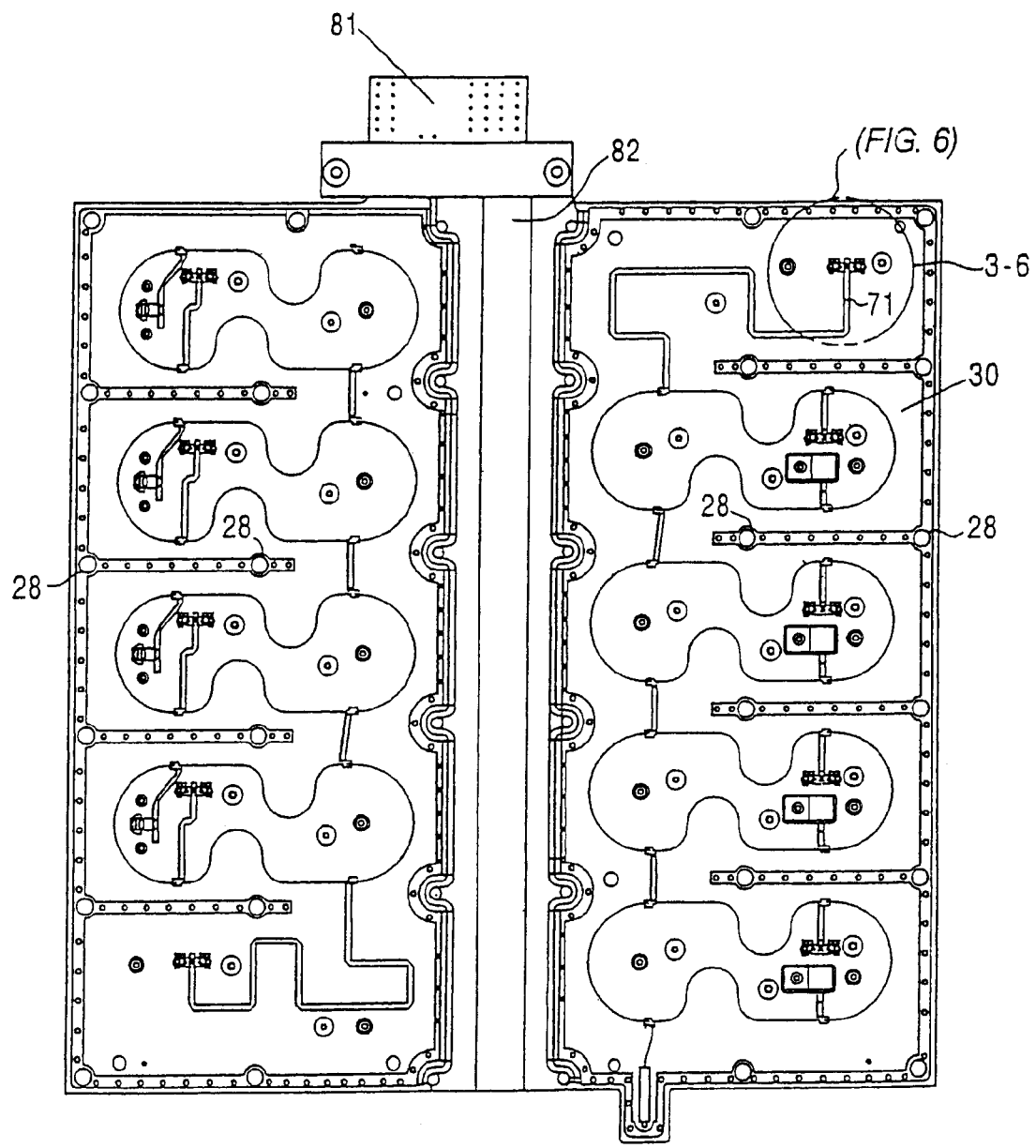
Figure 4:
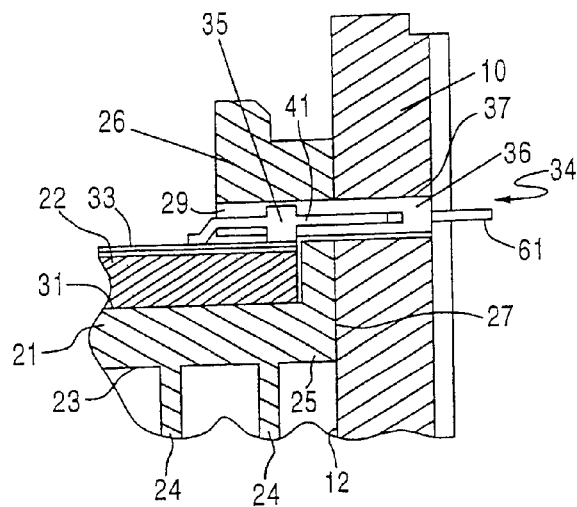
Figure 5:
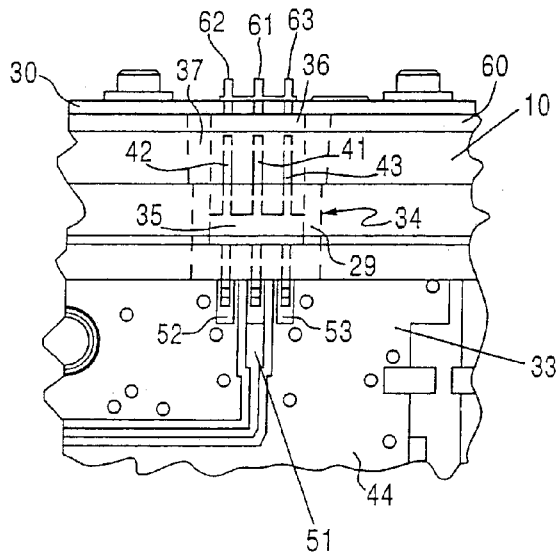
Figure 6:
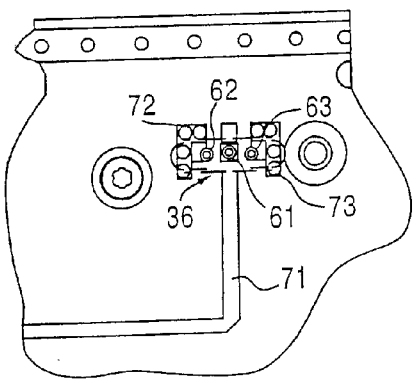

The enlarged side view of FIG. 5 and the enlarged partial bottom view of FIG. 6 show the female connector 36 having a center pin 61, connected to a section of microstrip conductor 71 of a RF distribution network 30 of a printed circuit board 60 mounted to the bottom side 14 of the base plate 10. As in the case of the connection of the male connector center pin 51 with the transmission line conductor of the RF printed circuit board 22, the geometry of the microstrip 71 in the vicinity of its connection with the center pin width, is tailored to provide impedance matching compensation between the female connector 35 and the microstrip of the RF distribution network 30. Measurements have shown that the mated pair of multi-pin connectors 35–36 has a VSWR less than 1.04:1, which is comparable with SMA coaxial connectors.

The additional pins 62 and 63 of the female connector 36 on either side of center pin 61 are attached to respective pads 72 and 73 that are electrically connected (grounded) by way of conductive vias to the base plate 10, so as to provide effective shielding for the RF signal center pins of the male and female portions of the three-pin connector 34.

The use of the orthogonal connector configuration described above, using relatively inexpensive and reduced size, multi-pin in-line connectors provides a number advantages over conventional coaxial connectors. First, coaxial connectors typically must be installed manually on the circuit in which they are used, as opposed to the use of robotic installation of the multi-pin connectors used in the invention. Also, coaxial connectors require extra room, due to the considerable length along their axis in order to mate two devices together. Multiple connections on a single assembly often require that the connectors "float" for proper alignment—something that is readily achieved by the mated connector pairs of the invention, as described above. A further shortcoming of conventional coaxial connectors is the fact that the cost per mated pair of coaxial connectors can often be a significant percentage of a unit's cost.

DC power distribution to the components of the invention is readily accomplished by means of a separate DC power and control circuit board 80, having a connector 81 and which may be mounted to the back side of the divider/combiner support base plate 10 into which each RF circuit card and heat sink module 20 is plugged. As shown in the bottom view of FIG. 3, with RF connections located adjacent to the outer edges of the modules 20, a region or area 82 between the RF connectors 34 is employed to provide DC power distribution from the board 80. This area 82 would normally be wasted space in a conventional co-planar amplifier layout. However, with the DC distribution board 80 attached to the divider/combiner assembly, as shown, all of the RF and DC connector pins are aligned with one another, allowing an RF module 20 to be blind-mated and retained in position.

From the foregoing description, it will be appreciated that the orthogonal connector approach of the invention successfully addresses all of these issues. In place of a coax connector, a mated pair of relatively inexpensive, three-pin, surface mount connector components are used, with the male connector 35 being an SMT component that can be readily attached to the printed circuit board 22 using standard pick and place equipment. Also, in addition to the reduced length of a mated multi-pin connector pair (e.g., one-half that of a typical SMA connector pair), the square-post female connector has a small amount of float or play in the contacts, that allows for blind mating of the connector halves, within the mechanical tolerances of the orthogonal connector architecture.

As described above, in terms of its effectiveness in coupling RF signals, the center pin of the three-pin connector corresponds functionally to the center conductor of a coaxial transmission line, while the two adjacent outer pins provide the ground path for this three-conductor transmission line. Depending upon the intended impedance of the transmission line, the impedance of the three-pin connector may be compensated (as by geometry sizing and shaping) to ensure that it matches a prescribed impedance (e.g., a 50 ohm transmission line).

While we have shown and described an embodiment in accordance with the present invention, it is to be understood that the same is not limited thereto but is susceptible to numerous changes and modifications as known to a person skilled in the art. we therefore do not wish to be limited to the details shown and described herein, but intend to cover all such changes and modifications as are obvious to one of ordinary skill in the art.

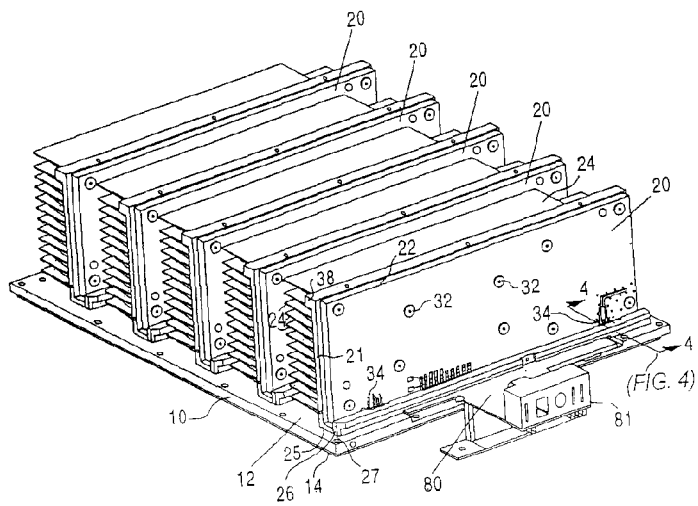

What is claimed:

1. A support architecture for a plurality of printed circuit boards containing RF signaling circuits comprising:

a base plate having first and second sides and containing apertures therethrough in which first multi-pin connectors are supported in an orientation that is generally transverse to said base plate;

RF signal distribution networks associated with said RF signaling circuits of said printed circuit boards, disposed on said first side of said base plate, and coupled to said first multi-pin connectors; and a plurality of a printed circuit board mounting modules affixed on said second side of said base plate in mutually adjacent, spatially separated relationship, and configured to support said plurality of printed circuit boards in a direction that is generally transverse to said second side of said base plate, and having convectively cooled heat exchangers integral therewith that extend into gaps between spaced apart printed circuit board mounting modules;

a respective printed circuit board having a first side thereof coupled with a respective printed circuit board mounting module, and a second side thereof containing an RF signaling circuit and a second multi-pin connector having respective pins thereof connected to signal and RF signal ground conductors of said RF signaling circuit, said second multi-pin connector being adapted to engage a respective one of said first multi-pin connectors, so as to provide an RF signaling path between said RF signaling circuit of said respective circuit board on a module retained on said second side of said base plate and an associated RF signal distribution network on said first side of said base plate.

2. The support architecture according to claim 1, wherein a respective first multi-pin connector contains a first pin connected to an RF signal conductor of an RF signal distribution network and a plurality of second pins adjacent to said first pin and connected to an RF signal ground conductor on said first side of said base plate, and wherein a respective second multi-pin connector contains a first pin connected to an RF signal conductor of an RF signaling circuit and a plurality of second pins adjacent to said first pin and connected to an RF signal ground conductor on said second side of said RF circuit board.

3. The support architecture according to claim 1, wherein a respective first multi-pin connector comprises a first in-line, three-pin connector having a first, center pin connected to an RF signal conductor of an RF signal distribution network and a pair of second pins on opposite sides of said first pin and connected to RF signal ground on said first side of said base plate, and wherein a respective second multi-pin connector comprises a second in-line, three-pin connector having a first, center pin connected to an RF signal conductor of an RF signaling circuit and a plurality of second pins adjacent to said first pin and connected to an RF signal ground conductor on said second side of said RF circuit board.

4. The support architecture according to claim 3, wherein said first and second multi-pin connectors comprise female and male three-pin square post configured connectors of the type normally used for providing DC connectivity therethrough.

5. The support architecture according to claim 1, wherein a respective first multi-pin connector is supported in a generally floating condition in a respective aperture through said base plate, so as to provide for blind mating thereof with a respective second multi-pin connector.

6. The support architecture according to claim 5, wherein a respective printed circuit board mounting module has a flange portion that is configured to be coupled with said second side of said base plate, and includes a slot aligned with said respective aperture through said base plate.

7. A support architecture for RF circuits comprising a plurality of RF circuit cards retained in a generally stacked arrangement by associated edge-mountable RF printed circuit support and heat dissipation modules to spaced apart portions of a first side of a base plate, so that said RF circuit cards extend in a direction that is generally orthogonal to said base plate, said modules containing heat sink surfaces that project into spaces between adjacent ones of said modules, a second side of said base plate containing RF distribution networks for said RF circuit cards, and wherein said RF signal distribution networks are RF-coupled to said RF circuit cards by means of blind-mating, post type multi-pin connectors extending through said base plate.

8. The support architecture according to claim 7, wherein RF and DC connections for a respective RF circuit card are provided at a mounting edge of a module, with input and output RF connections spaced apart at opposite ends of said RF circuit card and DC power connected generally near a central portion of said RF circuit card.

9. The support architecture according to claim 7, wherein a respective multi-pin connector contains a first connector portion having a center pin connected to an RF signal conductor of an RF signal distribution network and a plurality of second pins adjacent to said first pin and connected to an RF signal ground conductor on said first side of said base plate, and a second connector portion having a center pin connected to an RF signal conductor of an RF signaling circuit and a plurality of second pins adjacent to said first pin and connected to an RF signal ground conductor on said second side of said RF circuit card.

10. The support architecture according to claim 9, wherein said first and second multi-pin connector portions comprise female and male three-pin square post configured connectors of the type normally used for providing DC connectivity therethrough.

11. The support architecture according to claim 9, wherein a respective first multi-pin connector portion is supported in a generally floating condition in a respective aperture through said base plate, so as to provide for blind mating thereof with a respective second multi-pin connector portion.

12. The support architecture according to claim 11, wherein a respective module has a flange portion that is configured to be coupled with said second side of said base plate, and includes a slot aligned with said respective aperture through said base plate.

13. A method for housing and cooling a plurality of printed circuit boards containing RF signaling circuits comprising the steps of:

(a) providing a base plate having first and second sides and containing apertures therethrough in which first multi-pin connectors are supported in an orientation that is generally transverse to said base plate;

(b) supporting RF signal distribution networks associated with said RF signaling circuits of said printed circuit boards on said first side of said base plate, and coupling said networks to said first multi-pin connectors; and (c) affixing a plurality of a printed circuit board mounting and cooling modules on said second side of said base plate in mutually adjacent, spatially separated relationship, said modules being configured to support said plurality of printed circuit boards in a direction that is generally transverse to said second side of said base plate, and having convectively cooled heat exchangers integral therewith that extend into gaps between spaced apart printed circuit board mounting modules; and wherein a respective printed circuit board has a first side thereof coupled with a respective printed circuit board mounting module, and a second side thereof containing an RF signaling circuit and a second multi-pin connector having respective pins thereof connected to signal and RF signal ground conductors of said RF signaling circuit, said second multi-pin connector engaging a respective one of said first multi-pin connectors, so as to provide an RF signaling path between said RF signaling circuit of said respective circuit board on a module retained on said second side of said base plate and an associated RF signal distribution network on said first side of said base plate.

14. The method according to claim 13, wherein a respective first multi-pin connector comprises a first in-line, three-pin connector having a first, center pin connected to an RF signal conductor of an RF signal distribution network and a pair of second pins on opposite sides of said first pin and connected to RF signal ground on said first side of said base plate, and wherein a respective second multi-pin connector comprises a second in-line, three-pin connector having a first, center pin connected to an RF signal conductor of an RF signaling circuit and a plurality of second pins adjacent to said first pin and connected to an RF signal ground conductor on said second side of said RF circuit board.

15. The method according to claim 14, wherein said first and second multi-pin connectors comprise female and male three-pin square post configured connectors of the type normally used for providing DC connectivity therethrough.

16. The method according to claim 13, wherein a respective first multi-pin connector is supported in a generally floating condition in a respective aperture through said base plate, so as to provide for blind mating thereof with a respective second multi-pin connector.

17. The method according to claim 16, wherein a respective printed circuit board mounting module has a flange portion that is configured to be coupled with said second side of said base plate, and includes a slot aligned with said respective aperture through said base plate.

* * * * *

UNITED STATES PATENT AND TRADEMARK OFFICE
CERTIFICATE OF CORRECTION

PATENT NO.    : 6,407,923 B1
DATED         : June 18, 2002
INVENTOR(S)   : Kevin C. Gerlock et al.

It is certified that error appears in the above-identified patent and that said Letters Patent is hereby corrected as shown below:

Title page, should be deleted and substitute therefore the attached title page.

The drawing sheets, consisting of Figs. 1-6, should be deleted to be replaced with the drawing Figs. 1-6, as shown on the attached pages.

Column 1,
Line 29, delete "of the base plate, and are electrically (RF). Coupled to the RF" insert
-- of the base plate, and are electrically (RF) Coupled to the RF --
Line 21, delete "post type multi pin connectors that extend through the base" insert
-- post type multi-pin connectors that extend through the base --

Signed and Sealed this

Sixth Day of May, 2003

JAMES E. ROGAN
*Director of the United States Patent and Trademark Office*

United States Patent
Gerlock et al.

(10) Patent No.: US 6,407,923 B1
(45) Date of Patent: Jun. 18, 2002

(54) SUPPORT AND COOLING ARCHITECTURE FOR RF PRINTED CIRCUIT BOARDS HAVING MULTI-PIN SQUARE POST TYPE CONNECTORS FOR RF CONNECTIVITY

(75) Inventors: Kevin C. Gerlock, Santa Clarita; Klaas B. Bol, Los Gatos, both of CA (US)

(73) Assignee: Spectrian Corporation, Sunnyvale, CA (US)

(*) Notice: Subject to any disclaimer, the term of this patent is extended or adjusted under 35 U.S.C. 154(b) by 11 days.

(21) Appl. No.: 09/734,230

(22) Filed: Dec. 11, 2000

(51) Int. Cl.[7] ............................................. H01K 7/20
(52) U.S. Cl. .................. 361/704; 361/719; 361/775; 174/262; 439/55; 439/59; 257/723; 257/724; 330/295
(58) Field of Search .................. 361/687, 695, 361/683, 704, 707, 712, 721, 717–719, 748, 749, 760–763, 764, 775, 786–789, 792; 257/713, 720, 723–725; 174/16.3, 254, 252, 260, 262, 52.1, 52.6; 439/59, 62, 65, 67, 485–487, 61, 260; 330/295, 307, 286, 65–67; 333/125, 128, 136–137, 248, 250, 256, 257

(56) References Cited

U.S. PATENT DOCUMENTS

| | | | |
|---|---|---|---|
| 3,593,174 A | 7/1971 | White | 330/53 |
| 4,677,393 A | 6/1987 | Sharma | 330/286 |
| 4,724,400 A | 2/1988 | Luettgenau | 330/295 |
| 4,812,782 A | 3/1989 | Ajioka | 330/286 |
| 5,031,072 A | 7/1991 | Malhi et al. | 361/387 |
| 5,032,798 A | 7/1991 | Myer | 330/295 |
| 5,087,888 A | 2/1992 | Mountz et al. | 330/65 |
| 5,111,166 A | 5/1992 | Plonka et al. | 333/128 |
| 5,119,051 A | 6/1992 | Myer | 333/233 |
| 5,159,290 A | 10/1992 | Bartley et al. | 330/295 |
| 5,164,689 A | 11/1992 | Plonka | 333/128 |
| 5,329,248 A | 7/1994 | Izadian | 330/295 |
| 5,352,991 A | 10/1994 | Lispchultz et al. | 330/289 |
| 5,545,924 A * | 8/1996 | Contolatis et al. | 257/724 |
| 5,561,397 A | 10/1996 | Kumar et al. | 330/295 |
| 5,668,409 A | 9/1997 | Gaul | 257/723 |
| 5,930,112 A * | 7/1999 | Babinski et al. | 361/695 |
| 5,945,746 A * | 8/1999 | Tracewell et al. | 307/43 |
| 5,956,236 A | 9/1999 | Corisis et al. | 361/783 |
| 6,317,345 B1 * | 11/2001 | Hayward et al. | 363/65 |

* cited by examiner

*Primary Examiner*—Darren Schuberg
*Assistant Examiner*—Michael Datskovsky
(74) *Attorney, Agent, or Firm*—Allen, Dyer, Doppelt, Milbrath & Gilchrist, P.A.

(57) ABSTRACT

An 'orthogonally stacked' support and cooling architecture for RF signaling circuits includes a plurality of RF amplifier circuit cards mounted on edge-mountable RF printed circuit support and heat dissipation modules, that are affixed to a first side of a base plate, so that the RF circuit cards extend in a direction that is generally orthogonal to the base plate. Arranged on a second side of the base plate are RF distribution networks for the RF circuit cards. The RF signal distribution networks are RF-coupled to the RF printed circuit boards by blind-mating, square post type multi-pin connectors through the base plate. Orienting the RF distribution networks in a plane orthogonal to the RF circuit cards and having the heat exchangers extend into gaps between the modules serves to considerably reduce the size of the architecture.

17 Claims, 3 Drawing Sheets